(12) United States Patent
Brenk et al.

(10) Patent No.: US 8,994,379 B2
(45) Date of Patent: Mar. 31, 2015

(54) METHOD AND DEVICE FOR INSULATION MONITORING OF NON-GROUNDED ELECTRICAL DC AND AC GRIDS

(75) Inventors: Frank Brenk, Hausach (DE); Franz-Otto Witte, Teningen (DE); Wolfram Strepp, Freiburg (DE)

(73) Assignee: ABB AG, Mannheim (DE)

( * ) Notice: Subject to any disclaimer, the term of this patent is extended or adjusted under 35 U.S.C. 154(b) by 600 days.

(21) Appl. No.: 13/297,022

(22) Filed: Nov. 15, 2011

(65) Prior Publication Data
US 2012/0119754 A1    May 17, 2012

Related U.S. Application Data

(63) Continuation of application No. PCT/EP2010/002418, filed on Apr. 21, 2010.

(30) Foreign Application Priority Data

May 19, 2009 (DE) .......................... 10 2009 022 003
Oct. 5, 2009 (DE) .......................... 10 2009 048 294

(51) Int. Cl.
  *G01R 27/18* (2006.01)
  *G01R 31/02* (2006.01)
(52) U.S. Cl.
  CPC .............. *G01R 27/18* (2013.01); *G01R 31/025* (2013.01)
  USPC ....................................................... 324/509
(58) Field of Classification Search
  USPC ....................................................... 324/509
  See application file for complete search history.

(56) References Cited

U.S. PATENT DOCUMENTS

| 6,233,594 B1* | 5/2001 | Tan et al. ....................... 708/313 |
| 2002/0196030 A1* | 12/2002 | Kamitani ....................... 324/523 |
| 2009/0254290 A1* | 10/2009 | Kim et al. ....................... 702/63 |

FOREIGN PATENT DOCUMENTS

| DE | EP0903899 | * | 3/1999 | .............. H04L 27/30 |
| DE | 101 06 200 C1 | | 9/2002 | |
| EP | 0 654 673 A1 | | 5/1995 | |

OTHER PUBLICATIONS

Machine translation of include reference DE 10106200—See IDS filed Nov. 15, 2011—date of reference is Sep. 5, 2002.*

(Continued)

*Primary Examiner* — Jeff Natalini
(74) *Attorney, Agent, or Firm* — Buchanan Ingersoll & Rooney PC

(57) ABSTRACT

Exemplary methods are directed to insulation monitoring of non-grounded electrical DC power supply systems and AC power supply systems which have a resistive ($R_f$) and capacitive ($C_f$) insulation impedance between the power supply system and ground. The method includes applying a pulsed AC voltage ($U_0$) having alternately different pulsed voltage values to the power supply system to be monitored via a resistive system interface ($R_i$) between the power supply system and ground. The insulation impedance ($R_f$) between the power supply system and ground is determined using time profiles of transient processes of the measurement voltage ($V_m$) prior to transient recovery of the power supply system to the respective pulsed voltage value ($U_0$) of two polarity-inverted pulsed voltage value application processes.

13 Claims, 2 Drawing Sheets

(56) References Cited

OTHER PUBLICATIONS

International Search Report (PCT/ISA/210) issued on Aug. 25, 2010, by European Patent Office as the International Searching Authority for International Application No. PCT/EP2010/002418.

A. Rathi, "Insulation Monitoring and Earth Fault Detection in 3 Phase 3 Wire Unearthed Systems", Mar. 2007, 4 pages, retrieved from the internet: http://www.Intebg.com/news/upload/current-trends/2007%20Jan.-Mar.pdf.

D. Bruijnen et al., "Efficient IIR Notch Filter Design Via Multirate Filtering Targeted at Harmonic Disturbance Rejection", 6 pages, retrieved from the internet: http://www.mate.tue.nl/mate/pdfs/6588.

\* cited by examiner

METHOD AND DEVICE FOR INSULATION MONITORING OF NON-GROUNDED ELECTRICAL DC AND AC GRIDS

RELATED APPLICATION(S)

This application claims priority as a continuation application under 35 U.S.C. §120 to PCT/EP2010/002418, which was filed as an International Application on Apr. 21, 2010 designating the U.S., and which claims priority to German Application 10 2009 022 003.8 filed in Germany on May 19, 2009, and German Application 10 2009 048 294.6 filed in Germany on Oct. 5, 2009. The entire contents of these applications are hereby incorporated by reference in their entireties.

FIELD

The disclosure relates to electrical DC and AC grids, such as, a method for insulation monitoring of non-grounded electrical DC power supply systems and AC power supply systems which have an unavoidable resistive and capacitive insulation impedance between the power supply system and ground, and to a device for insulation monitoring of non-grounded electrical DC power supply systems and AC power supply systems which have a resistive and capacitive insulation impedance between the power supply system and ground.

BACKGROUND INFORMATION

A method of the generic type is described in EP 0 654 673 B1, for example. In known measurement methods, a stable, settled state of the measurement current or of a variable derived therefrom as measurement voltage should to be achieved for the evaluation of the measurement. Only once the settled state has been reached are the measurement values for determining the insulation impedance system insulation an additional potential risk and therefore should be avoided. In EP 0 654 673 B1, mean-value generation in the form of an arithmetic mean is used in the detection and evaluation of the measurement voltage.

SUMMARY

An exemplary method for insulation monitoring of non-grounded electrical DC power supply systems and AC power supply systems which have a resistive ($R_f$) and capacitive ($C_f$) insulation impedance between the power supply system and ground is disclosed, comprising: applying a pulsed AC voltage ($U_0$) having alternately different pulsed voltage values to the power supply system to be monitored via a resistive system interface ($R_i$) between the power supply system and ground; monitoring a time profile of the transient process of the measurement current, which is dependent on the instantaneous power supply system, or a variable derived therefrom as measurement voltage ($V_m$) for each pulsed voltage value ($U_0$); and determining the insulation impedance ($R_f$) between the power supply system and ground using the time profiles of the transient processes of the measurement voltage ($V_m$) prior to the transient recovery of the power supply system to the respective pulsed voltage value ($U_0$) of two polarity-inverted pulsed voltage value application processes.

An exemplary device for insulation monitoring of non-grounded electrical DC power supply systems and AC power supply systems is disclosed. The DC power supply systems and AC power supply systems have a resistive ($R_f$) and capacitive ($C_f$) insulation impedance between the power supply system and ground, having a pulsed AC voltage source for applying a pulsed AC voltage ($U_0$) having alternately different pulsed voltage values to the power supply system to be monitored via a resistive system interface ($R_i$) between the power supply system and ground, and a monitoring apparatus for monitoring a time profile of the transient process of the measurement current, which is dependent on the instantaneous power supply system, or a variable derived therefrom as measurement voltage ($V_m$) for each pulsed voltage value ($U_0$), the device comprising: a measuring device for detecting the time profiles of the transient processes of the measurement voltage ($V_m$) prior to the transient recovery of the power supply system to the respective pulsed voltage value ($U_0$) of two polarity-inverted pulsed voltage value application processes; and an apparatus for parameter estimation of model parameters of a calculated time profile of the transient process of the measurement voltage ($V_m$) for determining the insulation impedance ($R_f$) between the power supply system and ground from a parameter of the model.

BRIEF DESCRIPTION OF THE DRAWINGS

The figures and the description serve to provide better understanding of the subject matter. Items or parts of items which are substantially identical or similar can be provided with the same reference symbols. The figures are merely a schematic illustration of an embodiment of the disclosure.

DETAILED DESCRIPTION

Figure 1:
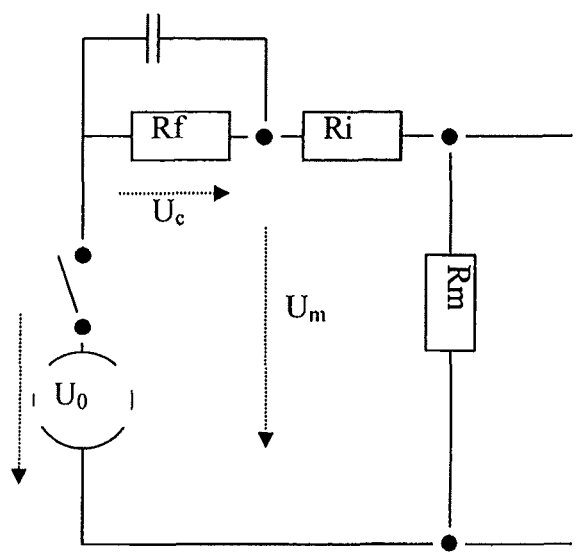
FIG. 1 shows an electrical equivalent circuit diagram for determining the measurement voltage in accordance with an exemplary embodiment of the present disclosure.

Exemplary embodiments of the present disclosure are directed to developing a method of the generic type such that the measurement time is shortened, and to providing an improved device for insulation monitoring.

In exemplary embodiments of the present disclosure, the time profiles of the transient processes of the measurement voltage prior to the transient recovery of the power supply system to the respective pulsed voltage value of two polarity-inverted pulsed voltage value application processes are used for determining the insulation impedance between the power supply system and ground. An advantage of an exemplary method according to the present disclosure provides that the insulation impedance can therefore be determined more quickly since it is no longer necessary to wait until the settled state has been reached. The value of the measurement voltage is still determined for the settled state, as before. Nevertheless, the settled value in the settled state can be predicted even at an earlier point in time from the time profiles of the transient processes when the settled state has actually not even been reached.

In accordance with an exemplary embodiment of the present disclosure, the two polarity-inverted pulsed voltage value application processes are successive in time. Rapid implementation of the measurement is thus ensured.

In accordance with another exemplary embodiment of the present disclosure, the measured time profile of the transient process of the measurement voltage prior to the transient recovery of the power supply system is used to estimate model parameters for a calculated time profile of the transient process and the insulation impedance is determined from a model parameter. An advantage of this exemplary procedure provides that the measurement can be terminated even before the settled state has been reached since the value for the insulation impedance which is sought is not determined from the measurement value but from a parameter of a model. This opens up the possibility of theoretically predicting the settled state even at an early point in time by means of the model and then determining the insulation impedance from this, wherein this point in time is earlier than the time at which the settled state is actually reached.

In accordance with an exemplary embodiment of the present disclosure, during the transient process prior to reaching the settled state, the model parameters are varied until the discrepancy between the measured and the calculated time profile of the transient process of the measurement voltage falls below a predeterminable threshold. In this case, the model is matched so effectively to the real transient process that it predicts the values of the model parameters for times in the future with a very high degree of reliability and therefore the insulation impedance in the settled state can be calculated from the model. The settled state is to a certain extent predicted using a model.

In accordance with an exemplary embodiment of the present disclosure, the measured time profile of the transient process of the measurement voltage is filtered by means of multirate filtering with recursive decimation filters. As a result, disruptive radiofrequency signal components are removed from the signal, with the result that the comparison with the values calculated from the model is less prone to error.

In accordance with another exemplary embodiment of the present disclosure, the discrepancy between the measured and the calculated time profile of the transient process of the measurement voltage between the sampling points on the measured profile is minimized in accordance with the method of least squares.

In accordance with an exemplary embodiment of the present disclosure, in a first decimation stage for filtering out radiofrequency signal components, the sampling rate of the input signal is stepped down, for example by a factor of four. As a result, radiofrequency signal components are removed effectively and the specified computation power is reduced, without changing the measurement result.

In accordance with another exemplary embodiment of the present disclosure, after the first decimation stage, a notch filter for suppressing the AC component of the system voltage is provided. In this case, the system voltage can be measured independently and fed via a separate signal input.

In accordance with another exemplary embodiment of the disclosure, in a second decimation stage, the sampling frequency can be further reduced for further signal smoothing. As a result, the computation complexity for the evaluation is reduced and further signal smoothing is achieved.

In accordance with an exemplary embodiment of the disclosure, further notch filters can be used for further suppression of the system frequency.

In accordance with an exemplary embodiment of the present disclosure, the second pulsed voltage value application process can be started in phase synchronism with the system frequency for further interference suppression.

An exemplary device according to the present disclosure can include a measuring device for detecting the time profiles of the transient processes of the measurement voltage prior to the transient recovery of the power supply system to the respective pulsed voltage value of two polarity-inverted pulsed voltage value application processes, and an apparatus for parameter estimation of model parameters of a calculated time profile of the transient process of the measurement voltage for determining the insulation impedance between the power supply system and ground from a parameter of the model.

Exemplary embodiments of the present disclosure can therefore provide a method and a device in which the profile of the measurement voltage during the transient process is investigated and is used to estimate system parameters. The measurement voltage during the transient process is not averaged in the process, but is freed of radiofrequency signal components by multirate filtering with recursive decimation filters. As a result, artifacts which can occur in the case of simple, for example, smoothing, mean-value generation in accordance with known systems can be completely avoided.

Estimating the system parameters dispenses with the need for waiting until the transient process has decayed. Since the time of the transient process can enter the region of several tens of seconds, in particular in the case of high capacitances in the power supply system with respect to ground, a considerable acceleration can be achieved by an exemplary method described herein.

FIG. 1 shows an electrical equivalent circuit diagram for determining the measurement voltage in accordance with an exemplary embodiment of the present disclosure. As shown in FIG. 1 $R_f$ denotes the resistive component of the insulation impedance of the line to be monitored between the power supply system and ground, $C_f$ denotes the capacitive component of the insulation impedance of the line to be monitored between the power supply system and ground, $U_0$ is the voltage source with which the pulsed AC voltage supplying various pulsed voltage values is impressed, $R_i$ is the internal resistance of the resistive system interface of the pulsed AC voltage $U_0$, and $R_m$ is a measuring resistance. The aim of the method is to determine $R_f$.

Circuit analysis of the above simplified circuit taking into consideration the initial state of charge of the capacitor $C_f$ results in the following relationship for the time profile of the measurement voltage $V_m$ as the voltage drop across the series circuit comprising $R_i$ and $R_m$:

$$UmD(t) = \frac{U_0}{1+K} + \left(\frac{U_0}{1+K} - U_{C0}\right)e^{\frac{-(1+K)t}{\tau}},$$

where:

$$K = \frac{R_f}{R_m + R_i}, \tau = R_f C_f, U_{c0} = \text{Initial voltage of } C_f$$

This relationship shows that the output voltage $Um_O$ converges towards a limit value $$O = \frac{U_0}{1+K}.$$

This is the value in the settled state. The initial value is dependent on the state of charge of the system capacitance with respect to ground $U_{c0}$ and the limit value O. The terms in the above equation can also be sorted as follows:

$$V_m = \frac{U_0}{1+K} + \left(\frac{U_0}{1+K} - U_{c0}\right) e^{\frac{-(1+K)t}{\tau}}$$

As a result, therefore, a transient process is produced which is dependent on the constants O, $$A = \frac{U_0}{1+K} - U_{c0}$$

and $$\lambda = \frac{(1+K)}{\tau}$$

Therefore, the following expression can be used as a model for the basic profile of the measurement voltage:

$$UmD(t) = O + Ae^{-\lambda t} \quad (0)$$

The charge voltage of the capacitor $U_{c0}$ can be used as a negative variable in the predetermined measurement principle since, in general, a precharge from the preceding half-cycle with a negative polarity remains.

This curve profile corresponds to the unfiltered and smoothed measurement signal. The influence of the smoothing substantially corresponds to a convolution with the step response of the smoothing filter $$H(z) = \sum_{k=0}^{+\infty} h_k z^{-k}$$

with the coefficient $h_k$. The smoothed measurement voltage $V_{mD}$ can therefore be described by the following expression.

$$VmD(t_k, \lambda, O, A) = \sum_{i=-\infty}^{+\infty} UmD(t_i, \lambda, O, A) \cdot h_{k-i} \quad (1)$$

The measured curve profile is compared with a modeled curve profile. As a result of this comparison, the characteristics $\lambda$, O and A of a theoretical curve profile are determined.

One possibility for determining the characteristics is the use of the method of least squares, which will be described below.

An exemplary embodiment of the present disclosure is directed to determining the parameters $\lambda$, O and A such that the filtered theoretical profile $VmD(t_k, \lambda, O, A)$ corresponds as much as possible to the measured values $VmD_k$. In the mentioned method of least squares, the error between the sampling points of the measured curve and the model curve is minimized. This takes place by virtue of the following expression:

$$E = \sum_{k=1}^{n} dy_k^2 \quad (2)$$

where:

$$dy_k = VmD_k - VmD(t_k, \lambda, O, A).$$

Differentiating E by the parameters $\lambda$, O and A and setting these derivatives to 0 finally gives the following formula:

$$\begin{pmatrix} d\lambda \\ dO \\ dA \end{pmatrix} = (H^t H)^{-1} H^t \begin{pmatrix} dy_1 \\ \vdots \\ dy_n \end{pmatrix} \quad (3)$$

where H is the Jacobi matrix:

$$H(\lambda, O, A) = \quad (4)$$

$$\begin{pmatrix} \frac{\partial VmD(t_1, \lambda, O, A)}{\partial \lambda} & \frac{\partial VmD(t_1, \lambda, O, A)}{\partial O} & \frac{\partial VmD(t_1, \lambda, O, A)}{\partial A} \\ \vdots & \vdots & \vdots \\ \frac{\partial VmD(t_n, \lambda, O, A)}{\partial \lambda} & \frac{\partial VmD(t_n, \lambda, O, A)}{\partial O} & \frac{\partial VmD(t_n, \lambda, O, A)}{\partial A} \end{pmatrix}.$$

The derivatives occurring in equation (4) can be determined using equation (1), for example:

$$\frac{\partial VmD(t_n, \lambda, O, A)}{\partial \lambda} = \sum_{i=-\infty}^{+\infty} \frac{\partial UmD(t_i, \lambda, O, A)}{\partial \lambda} \cdot h_{n-i}$$

In other words: it is possible simply to send the derivatives from equation (0) through the digital filter in order to calculate the terms occurring in equation (4).

The derivatives are:

$$\frac{\partial UmD(t, \lambda, O, A)}{\partial \lambda} = -t \cdot A \cdot e^{-\lambda t} \quad (5)$$

$$\frac{\partial UmD(t, \lambda, O, A)}{\partial O} = 1$$

$$\frac{\partial UmD(t, \lambda, O, A)}{\partial \lambda} = e^{-\lambda t}$$

It can be possible to calculate the factor $e^{-\lambda \Delta t}$ occurring in these derivatives and in equation (0) iteratively. When the same time interval $\Delta = t_{i+1} - t_i$ is always made, the following is true:

$$e^{-\lambda t_{i+1}} = e^{-\lambda t_i} \cdot e^{-\lambda \Delta t}$$

The factor $e^{-\lambda \Delta t}$ only needs to be calculated once.

The matrix multiplications in equation (3) are expediently divided into two terms, where the first:

$$H^t H$$

is a 3×3 matrix, and the second:

$$H^t \begin{pmatrix} dy_1 \\ \vdots \\ dy_n \end{pmatrix}$$

is a 3×1 matrix. The inversion of the first term can still be done without excessive complexity.

In certain situations, for example during factory calibration, the system leakage capacitance is zero, with the result that the curve profile of equation (0) becomes a constant:

$$UmD(t_i) = O$$

As a result, the derivatives according to $\lambda$ and A disappear in equation (5), and the matter is considerably simplified because the two terms mentioned above become 1×1 matrices.

The described method operates iteratively and specifies expedient start values $\lambda_0$, $O_0$ and $A_0$ for convergence acceleration. The result of formula (3) is the correction values $d\lambda$, $dO$ and $dA$, which give the new start values for the next run:

$$\begin{pmatrix} \lambda_1 \\ O_1 \\ A_1 \end{pmatrix} = \begin{pmatrix} \lambda_0 \\ O_0 \\ A_0 \end{pmatrix} + \begin{pmatrix} d\lambda \\ dO \\ dA \end{pmatrix}$$

If the correction values $d\lambda$, $dO$ and $dA$ are so small that there are no longer any notable changes for $\lambda$, $O$ and $A$, the process can be stopped.

Using equation (2), the (minimized) error $E_{min}$, which is a measure of how well the measurement values match the theoretical curve profile, is then given. If a sharp DC change occurs during the measurement period, for example, $E_{min}$ will increase, with the result that this value enables an assessment of the "quality" of the measurement.

In this case, known methods for convergence acceleration can also be used, such as the Levenberg-Marquardt method.

The above-described method functions when the start values are in the vicinity of the desired minimum for equation (2).

Since there is only one minimum, the method of "steepest descent" can also be used, with the correction values resulting from:

$$\begin{pmatrix} d\lambda \\ dO \\ dA \end{pmatrix} = N^{-1} H^t \begin{pmatrix} dy_1 \\ \vdots \\ dy_n \end{pmatrix}$$

where $$N_{ij} = (H^t H)_{ij}(1 + m \cdot \delta_{ij}),$$

where $\delta_{ij}$ is the Kronecker symbol, and m is a parameter >0. For m=0, the method described in the previous paragraph results; for high m values the method of steepest descent (or a variant thereof: Marquardt) is used.

Figure 2:
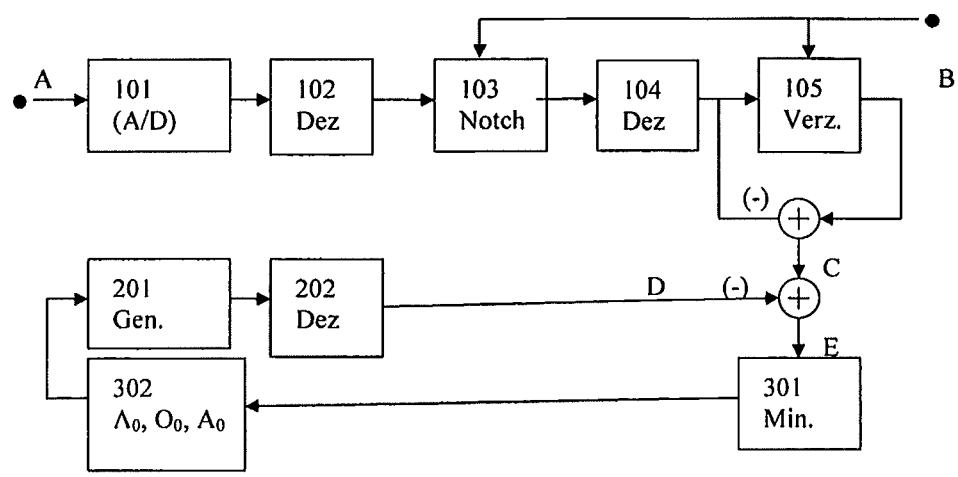
FIG. 2 shows an illustration of the functional sequence of the parameter estimation in accordance with an exemplary embodiment of the present disclosure.

The overall method can be illustrated using the flowchart illustrated in FIG. 2. FIG. 2 shows an illustration of the functional sequence of the parameter estimation in accordance with an exemplary embodiment of the present disclosure.

As shown in FIG. 2, the analog measurement voltage $V_m$, fed in at point A, first passes through an analog-to-digital converter 101. The sampling is performed at a relatively high sampling frequency, at approximately 2500 Hz, for example. In a first decimation stage 102, the sampling rate of the input signal is reduced by a factor of 4, for example. In this case, the radiofrequency signal components are eliminated. A further advantage of the decimation is that, as a result, the effective resolution of the signal can be improved by up to 3 dB each time the sampling frequency is halved. In the event of a reduction in the sampling rate by a factor of 2^2=4, ideally an S/N increase of up to 6 dB =1 bit can be achieved.

After the first decimation, a notch filter 103 suppresses the AC component of the system voltage of the power supply system, wherein the system period is measured in an independent branch and is fed in via the signal input B.

A second decimation stage 104 reduces the sampling frequency further in order to reduce the specified computation complexity for the evaluation stages and to obtain further signal smoothing.

The transient process for the negative half-cycle of the generator signal is subtracted, at summation point C, from the signal of the negative half-cycle which is subject to a time delay in a delay stage 105, as a result of which the amplitude of the measurement signal is doubled. If the start point of the negative half-cycle is also delayed such that it corresponds to the next integral multiple of the system period, remaining interference components of the system voltage, owing to the subtraction, are eliminated.

At a summation point E, a modeled curve profile D is subtracted from the thus generated differential signal, and said curve profile is passed from the generator 201 and the profile thereof through a decimation filter 202 as well. The difference is processed with the aid of an apparatus 301 for parameter estimation which produces an improved set of the three desired curve parameters $\lambda_0$, $O_0$, $A_0$ which are based on the modeled curve profile in the block 302.

The last-described process is iterated a few times until sufficient accuracy of the estimation parameters $\lambda$, $O$, $A$ is achieved.

Then, the value for the leakage resistance $R_f$ can be calculated from the parameter O by simple conversion.

The smoothing methods used function very well. In the case of low ground-fault impedances, however, the system frequency can interact to a considerable extent with the measurement. In order to prevent this occurrence, notch filters can be used in addition the other exemplary components provided in the circuit.

A further improvement of an exemplary method of the present disclosure can be achieved by suppressing interference by synchronizing the start time of the second measurement period. The second measurement period, the second half-cycle of the impressed AC voltage, is in this case started in phase synchronism with respect to the system frequency. By virtue of this synchronous delay, system frequencies in both measurement periods coincide with one another with time synchronism. During the subsequent evaluation of the transient process, the influence of the system frequency can be markedly reduced by the subtraction of corresponding transient recovery values, with the degree of suppression only being dependent on the constancy of the system frequency and the accuracy of the signal delay.

Thus, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A method for insulation monitoring of non-grounded electrical DC power supply systems and AC power supply systems which have a resistive ($R_f$) and capacitive ($C_f$) insulation impedance between the power supply system and ground comprising:
  applying a pulsed AC voltage ($U_0$) having alternately different pulsed voltage values to the power supply system to be monitored via a resistive system interface ($R_i$) between the power supply system and ground;
  monitoring a time profile of a transient process of the measurement current, which is dependent on the instantaneous power supply system, or a variable derived therefrom as measurement voltage ($V_m$) for each pulsed voltage value ($U_0$);

estimating model parameters for a calculated time profile of the transient process using the monitored time profile of the transient process of the measurement voltage ($V_m$) prior to a transient recovery of the power supply system; and determining the insulation impedance ($R_f$) between the power supply system and ground from a model parameter estimated using the time profiles of transient processes of the measurement voltage ($V_m$) prior to the transient recovery of the power supply system to a respective pulsed voltage value ($U_0$) of two polarity-inverted pulsed voltage value application processes.

2. The method as claimed in claim 1, wherein the two polarity-inverted pulsed voltage value application processes are successive in time.

3. The method as claimed in claim 2, comprising:
starting a second pulsed voltage value application process, in phase synchronism with the system frequency, for further interference suppression.

4. The method as claimed in claim 1, comprising:
prior to the transient recover of the power supply system, varying the model parameters until a discrepancy between the measured and the calculated time profile of the transient process of the measurement voltage falls below a predetermined threshold.

5. The method as claimed in claim 1, comprising:
filtering the measured time profile of the transient process of the measurement voltage $V_m$ by means of multirate filtering with recursive decimation filters.

6. The method as claimed in claim 5, comprising:
in a first decimation stage for filtering out radiofrequency signal components, stepping down the sampling rate of the input signal.

7. The method as claimed in claim 6, wherein after the first decimation stage, a notch filter for suppressing the AC component of the system voltage is provided.

8. The method as claimed in claim 7, comprising:
in a second decimation stage, reducing the sampling frequency for further signal smoothing.

9. The method as claimed in claim 8, comprising:
performing an additional suppression of the system frequency using additional notch filters.

10. The method as claimed in claim 1, comprising:
minimizing the discrepancy between the measured and the calculated time profile of the transient process of the measurement voltage between the sampling points of the measured profile in accordance with the method of least squares.

11. A device for insulation monitoring of non-grounded electrical DC power supply systems and AC power supply systems which have a resistive ($R_f$) and capacitive ($C_f$) insulation impedance between the power supply system and ground, having a pulsed AC voltage source for applying a pulsed AC voltage ($U_0$) having alternately different pulsed voltage values to the power supply system to be monitored via a resistive system interface ($R_i$) between the power supply system and ground, and a monitoring apparatus for monitoring a time profile of the transient process of the measurement current, which is dependent on the instantaneous power supply system, or a variable derived therefrom as measurement voltage ($V_m$) for each pulsed voltage value ($U_0$), the device comprising:

a measuring device for detecting the time profiles of the transient processes of the measurement voltage ($V_m$) prior to a transient recovery of the power supply system to a respective pulsed voltage value ($U_0$) of two polarity-inverted pulsed voltage value application processes; and an apparatus for parameter estimation of model parameters of a calculated time profile of the transient process of the measurement voltage ($V_m$) and for determining the insulation impedance ($R_f$) between the power supply system and ground from an estimated parameter of the model.

12. The device as claimed in claim 11, wherein the measuring device comprises a filter apparatus for implementing multirate filtering with recursive decimation filters.

13. The device as claimed in claim 12, wherein the filter device comprises a first decimation stage, a notch filter and a second decimation stage.

* * * * *